United States Patent
He et al.

(10) Patent No.: US 12,133,352 B2
(45) Date of Patent: Oct. 29, 2024

(54) DUAL PARALLEL PATH COOLING SYSTEM FOR DUAL SOCKET INFORMATION HANDLING SYSTEMS

(71) Applicant: Dell Products L.P., Round Rock, TX (US)

(72) Inventors: Qinghong He, Austin, TX (US); Ting-Chiang Huang, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 280 days.

(21) Appl. No.: 17/443,889

(22) Filed: Jul. 28, 2021

(65) Prior Publication Data

US 2023/0042502 A1 Feb. 9, 2023

(51) Int. Cl.
*H05K 7/20* (2006.01)
*G06F 1/20* (2006.01)
*F28D 21/00* (2006.01)

(52) U.S. Cl.
CPC .......... *H05K 7/20145* (2013.01); *G06F 1/20* (2013.01); *H05K 7/20172* (2013.01); *F28D 2021/0028* (2013.01)

(58) Field of Classification Search
CPC .......... H05K 7/20145; H05K 7/20154; H05K 7/20563; H05K 7/20572; H05K 7/20718; F28D 2021/0028; F28D 2021/0029
See application file for complete search history.

(56) References Cited

U.S. PATENT DOCUMENTS

| | | | | |
|---|---|---|---|---|
| 4,103,737 A | * | 8/1978 | Perkins | H01L 23/467 165/122 |
| 5,375,038 A | * | 12/1994 | Hardt | G06F 1/20 361/688 |
| 5,505,533 A | * | 4/1996 | Kammersqard | G06F 1/183 312/236 |
| 5,822,188 A | * | 10/1998 | Bullington | H05K 7/20145 361/695 |
| 6,888,725 B2 | * | 5/2005 | Kubo | H01L 23/467 361/719 |
| 7,167,363 B1 | * | 1/2007 | Cushman | H05K 7/20145 361/692 |
| 8,451,600 B1 | * | 5/2013 | Ross | H05K 7/20736 165/80.4 |

(Continued)

FOREIGN PATENT DOCUMENTS

| | | | | |
|---|---|---|---|---|
| CN | 101115371 A | * | 1/2008 | H05K 7/20581 |
| FR | 2983013 A1 | * | 5/2013 | G06F 1/181 |

(Continued)

*Primary Examiner* — Jenna M Maroney
(74) *Attorney, Agent, or Firm* — McDermott Will & Emery LLP

(57) ABSTRACT

An air duct for cooling dual socket information handling systems divides airflow into two parallel paths. Inner walls, a chassis divider and a top surface form a main channel. An intermediate divider and intermediate wall are positioned between the sockets, wherein airflow exiting the first socket is prevented from flowing through the second socket. Lower lateral channels and upper lateral channels are formed between each inner wall and a corresponding outer wall, wherein lower lateral channels allow airflow to bypass the first socket to cool the second socket and the upper lateral channels allow heated airflow exiting the first socket to bypass the second socket.

18 Claims, 5 Drawing Sheets

(56) References Cited

U.S. PATENT DOCUMENTS

| | | | | |
|---|---|---|---|---|
| 8,773,852 B2* | 7/2014 | Singleton | ........... | H05K 7/20836 361/679.48 |
| 9,417,671 B2* | 8/2016 | Farrow | ........... | G06F 1/20 |
| 9,578,786 B1* | 2/2017 | Beall | ........... | H05K 7/20754 |
| 9,807,911 B1* | 10/2017 | Bryan | ........... | H05K 7/20727 |
| 10,437,297 B1* | 10/2019 | Chen | ........... | G06F 1/187 |
| 10,624,233 B1* | 4/2020 | Huang | ........... | H05K 7/20727 |
| 2005/0241810 A1* | 11/2005 | Malone | ........... | F04D 25/166 165/122 |
| 2005/0259392 A1* | 11/2005 | Vinson | ........... | G06F 1/20 361/679.47 |
| 2006/0120043 A1* | 6/2006 | Wolford | ........... | H05K 1/0272 361/695 |
| 2007/0235168 A1* | 10/2007 | Chen | ........... | H05K 7/20727 257/E23.099 |
| 2009/0262497 A1* | 10/2009 | Beauchamp | ........... | G06F 1/185 361/695 |
| 2010/0214734 A1* | 8/2010 | Cho | ........... | G06F 1/20 361/695 |
| 2011/0081851 A1* | 4/2011 | Franz | ........... | H05K 7/20145 137/1 |
| 2012/0134113 A1* | 5/2012 | Lai | ........... | H05K 7/20727 454/251 |
| 2012/0268890 A1* | 10/2012 | Stock | ........... | G06F 1/20 361/679.53 |
| 2013/0083483 A1* | 4/2013 | Wei | ........... | H05K 7/20145 361/697 |
| 2013/0107454 A1* | 5/2013 | Wilke | ........... | H05K 7/20727 361/694 |
| 2013/0301217 A1* | 11/2013 | Lee | ........... | H05K 7/20145 165/100 |
| 2013/0342993 A1* | 12/2013 | Singleton | ........... | H05K 7/20836 361/690 |
| 2014/0036439 A1* | 2/2014 | Huang | ........... | H05K 7/20727 361/692 |
| 2014/0073234 A1* | 3/2014 | Elison | ........... | H05K 7/20727 361/695 |
| 2019/0116689 A1* | 4/2019 | Chen | ........... | H05K 7/20154 |
| 2019/0230825 A1* | 7/2019 | Kurozaki | ........... | H02M 7/003 |
| 2020/0100395 A1* | 3/2020 | Bryan | ........... | H05K 7/20727 |
| 2020/0329587 A1* | 10/2020 | Kinoshita | ........... | H05K 7/20172 |
| 2021/0274684 A1* | 9/2021 | Ni | ........... | H05K 7/20145 |
| 2022/0322568 A1* | 10/2022 | Liu | ........... | G06F 1/206 |

FOREIGN PATENT DOCUMENTS

| | | | | |
|---|---|---|---|---|
| KR | 101492320 B1 * | 2/2015 | | |
| WO | WO-2013072180 A1 * | 5/2013 | ............ | G06F 1/181 |
| WO | WO-2019049766 A1 * | 3/2019 | ............ | G06F 1/20 |

\* cited by examiner

DUAL PARALLEL PATH COOLING SYSTEM FOR DUAL SOCKET INFORMATION HANDLING SYSTEMS

BACKGROUND

Field of the Disclosure

This disclosure relates generally to information handling systems and, more particularly, to systems for cooling dual socket chassis for information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments disclosed herein may be generally directed to information handling systems and systems for cooling multiple heat sources such as CPUs that are serially positioned in a main duct.

A cooling system for a pair of heat sources aligned axially in an airflow may utilize four distinct paths separating the airflow into dual parallel cooling paths comprising four airflow paths, wherein two cooling paths direct first portions of the airflow for cooling a first heat source and divert second portions for bypassing the first heat source and cooling a second heat source and two cooling paths divert first portions for bypassing the first heat source and direct second portions for cooling the second heat source.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
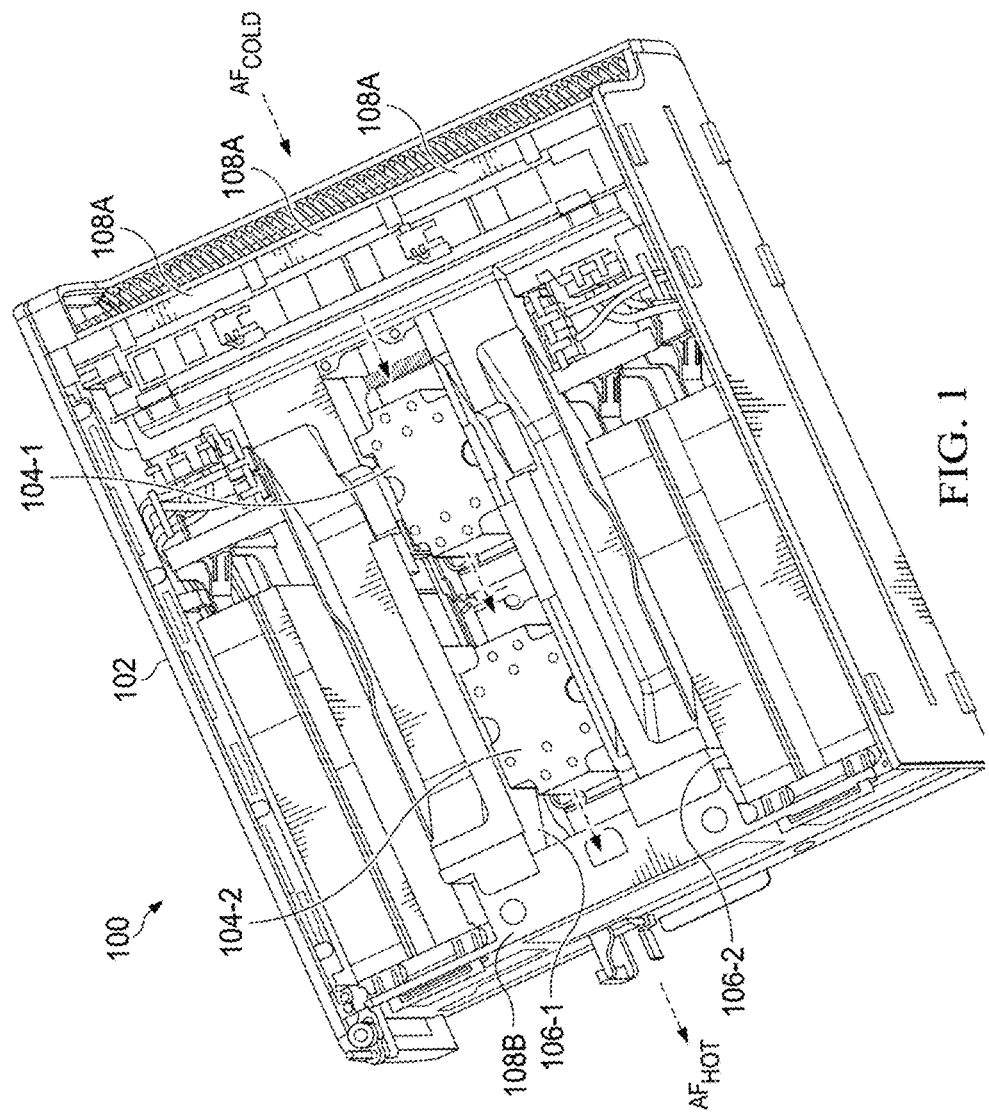
FIG. 1 is a top cutaway view of an example information handling system in a desktop chassis configured as a dual socket system with two heat sources aligned axially in a main duct.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, side wall "202-1" refers to an instance of a side wall, which may be referred to collectively as side walls "202" and any one of which may be referred to generically as side wall "202."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

In some desktop chassis referred to as dual socket information handling systems, two CPUs are positioned serially in an airflow duct. Each socket may have a processor such as a CPU assembled with one or more fin stacks. Embodiments disclosed herein include a dual parallel path cooling system for cooling a dual socket information handling systems.

Particular embodiments are best understood by reference to FIGS. 1-3 and 4A-4B, wherein like numbers are used to indicate like and corresponding parts.

Turning to the drawings, FIG. 1 illustrates a cutaway perspective view of an example information handling system 100 in chassis 102 with a common approach to cooling dual sockets 104-1 and 104-2. Sockets 104-1 and 104-2 are aligned axially between walls 106 relative to an airflow (AF) generated by fans 108A located on a first side of chassis 102 and second fans 108B located on an opposite side of chassis 102. Fans 108 draw in cool airflow ($AF_{COLD}$) and the heated airflow ($AF_{HOT}$) exits the other side of chassis 102.

Sockets 104-1 and 104-2 may include processors such as a central processing unit (CPU) or graphics processing unit (GPU), both of which may be a significant source of heat. For example, a CPU may consume 205 Watts of power and may generate heat such that the CPU can reach temperatures greater than 75 C unless the CPU is cooled. Sockets 104 further comprise fin stacks or other structures for distributing heat over a large surface area for better heat transfer to an airflow, discussed in greater detail below.

To cool two sockets 104, dual socket information handling systems 100 typically have a main duct formed between two walls 106, chassis divider 110 and a top surface (not shown) that isolate sockets 104 from other components and ensures the airflow generated by fans 108 flows through both sockets 104. Generally, walls 106, chassis divider 110 and a top surface (not shown) isolate the two sockets 104 such that a cold airflow ($AF_{COLD}$) at 35 C drawn in by fans 108A flows through the main duct to cool first socket 104-1 and second socket 104-2. Fans 108B may assist fans 108A in ensuring airflow flows through chassis 102 and the heated airflow ($AF_{HOT}$) exits chassis 102 to an ambient environment.

Heated Airflow from the First Heat Source is Used to Cool the Second Heat Source A problem with common approaches to cooling dual socket information handling systems is that, due to the serial positioning of the two sockets 104-1 and 104-2 in the same airflow path, airflow that passes by the first socket 104-1 is heated such that the airflow has less capacity to cool the second socket 104-2.

Figure 2:
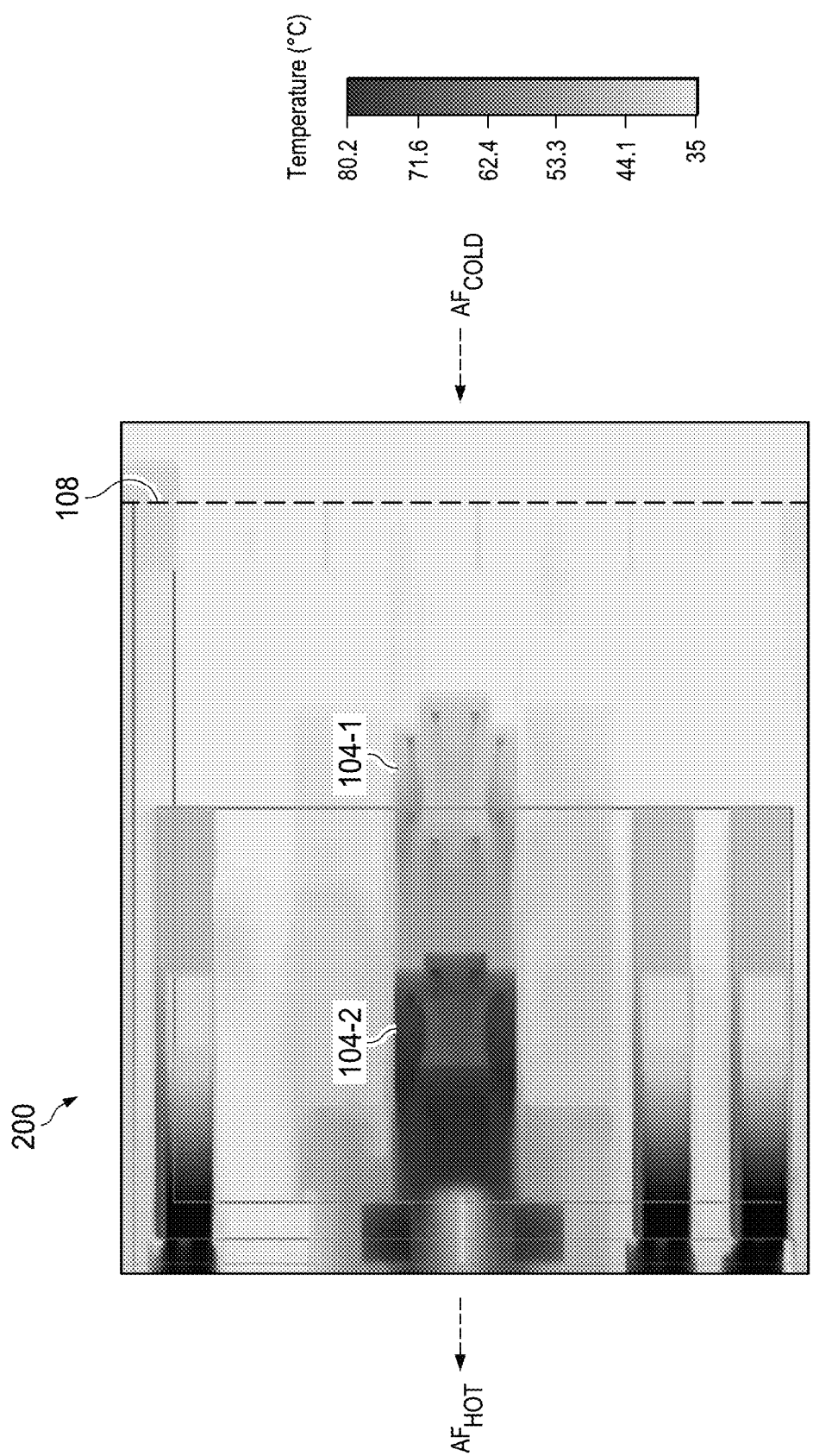
FIG. 2 is an image of a simulated temperature profile of the information handling system depicted in FIG. 1, illustrating effects of serially cooling dual socket systems.

FIG. 2 depicts an image of a temperature profile 200 for chassis 102 configured with two sockets 104-1 and 104-2 positioned in a main duct and aligned axially with a single airflow (AF) generated by fans 108, illustrating this problem.

If the ambient air temperature is 35 C, then airflow with a temperature of approximately 35 C may enter chassis 102 and flow through the main duct 10 to cool first socket 104-1. However, heat transfer from first heat source 104-1 to the airflow raises the airflow temperature such that airflow temperature used to cool second socket 104-2 is significantly higher. For example, for sockets 104 with CPUs operating at 205 W, airflow at 35 C may enter chassis 102 and cool first socket 104-1 to approximately 59 C. However, the airflow exiting first socket 104-1 may be heated to approximately 52 C. Since second socket 104-2 is aligned axially relative to the airflow, airflow entering second heat source 104-2 at approximately 52 C will have less capacity for heat transfer. If 75 C is a maximum operating temperature, then power to one or more of first socket 104-1 and second socket 104-2 may be throttled, reducing the overall processing capability of information handling system 100.

Figure 3:
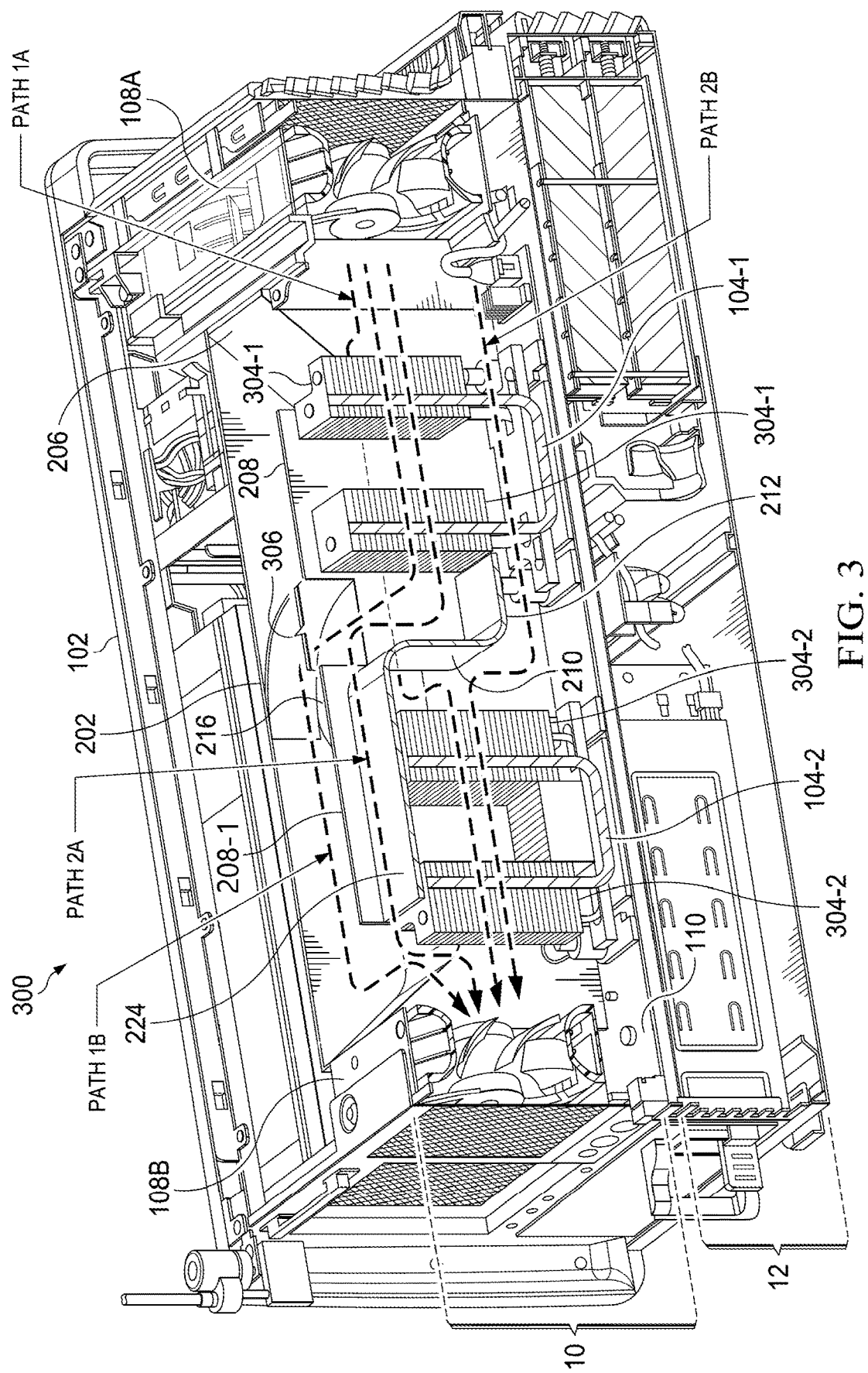
FIG. 3 is a cutaway partial perspective view of one embodiment of a dual parallel path cooling system, illustrating two sets of parallel paths for cooling dual socket systems.

Referring to FIG. 3, to facilitate cooling of a CPU or other processing component, socket 104-1 comprises a first pair of fin stacks 304-1 and socket 104-2 comprises a second pair of fin stacks 304-2. Each pair of fin stacks 304 may have a cover and a base such that the pair of fin stacks 304 are a single unit, wherein airflow entering a first fin stack also passes through a second fin stack in the pair of fin stacks 304. As depicted in FIG. 3, second fin stacks 304-2 may be taller than first fin stacks 304-1 and a base of fin stacks 304-1 to improve heat transfer from second fin stacks 304-2 to the hotter airflow passing through second socket 104-2. Embodiments may use this design as a part of a cooling system for improving cooling of second socket 104-2.

Figure 4A:
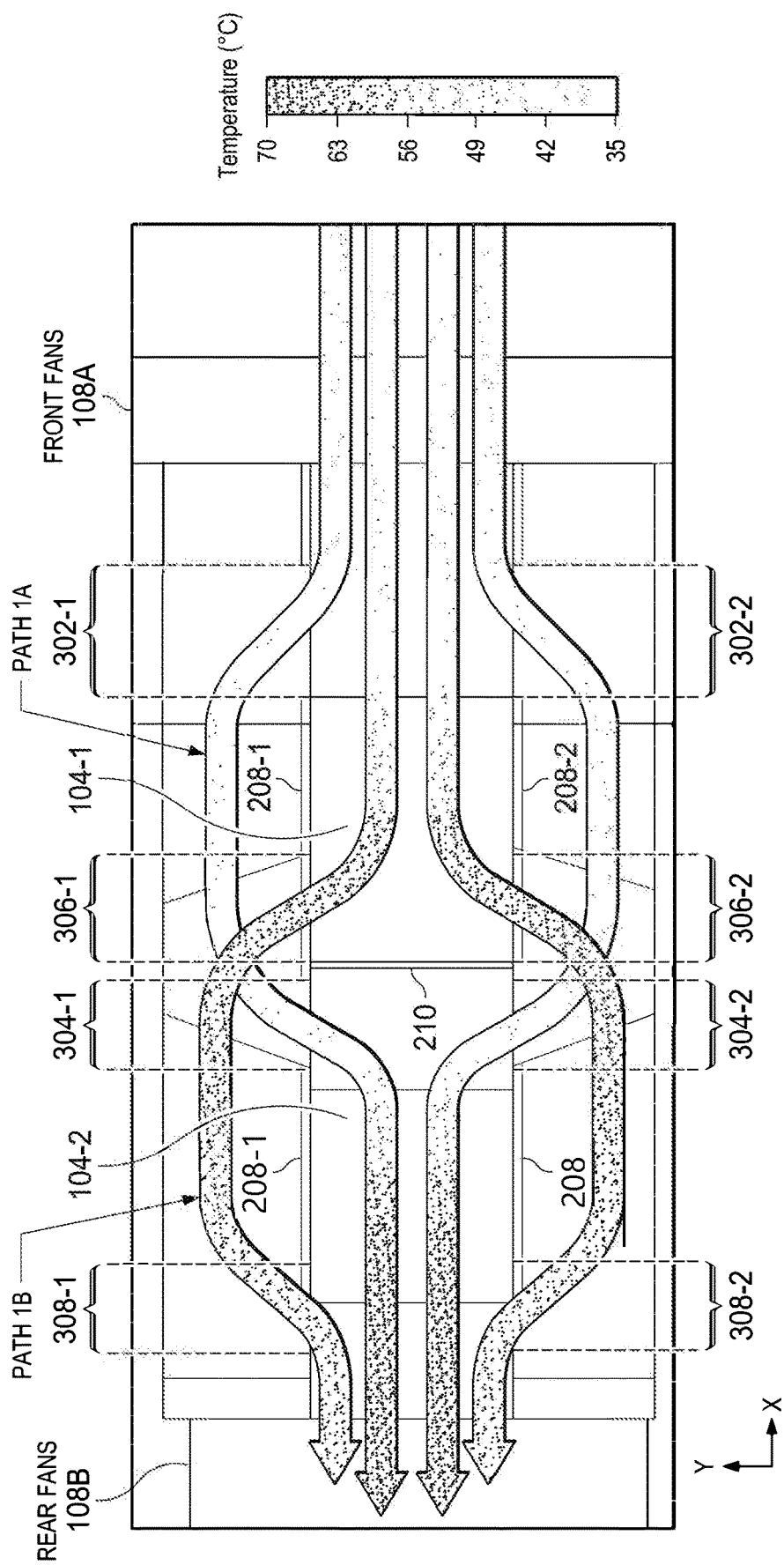
FIGS. 4A and 4B are cutaway top and side views, respectively, of one embodiment of a dual parallel path cooling system, illustrating two sets of parallel paths.
Figure 4B:
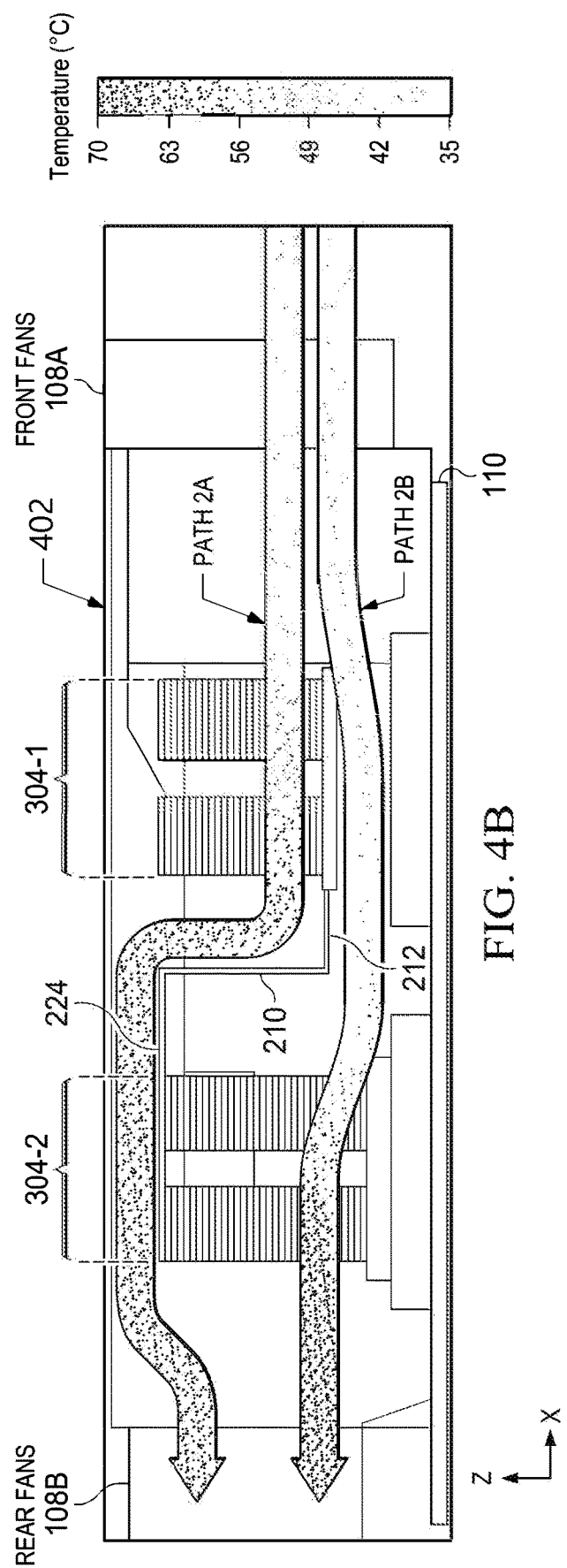

Referring to FIGS. 3, 4A and 4B, to improve cooling and therefore performance of dual socket information handling systems 100, embodiments may include a cooling system with fans 108 generating an airflow through air duct 300 configured for dividing an airflow into four portions 1A, 1B, 2A and 2B for a total of four airflows paths. A first airflow portion 1A and second airflow portion 1B form a first parallel path and third airflow portion 2A and fourth airflow portion 2B form a second parallel path. First airflow portion 1A and fourth airflow portion 2B bypass first socket 104-1 and cool second socket 104-2. Second airflow portion 1B and third airflow portion 2A cool first socket 104-1 and bypass second socket 104-2.

For ease of understanding, certain conventions are used herein. For example, referring to FIGS. 1 and 3, a common configuration of chassis 102 involves a memory duct 12 separated from main duct 10 by chassis divider 110. Since hot air rises, chassis 102 is commonly oriented such that memory duct 12 is "below" main duct 10, wherein heated airflow in main duct 10 rises and chassis divider 110 ensures heated airflow in main duct 10 has little or no effect on the cooling of components in memory duct 12. Accordingly, embodiments may be described based on chassis 102 oriented such that memory duct 12 is below main duct 10 and chassis divider 110 forms a bottom surface of main duct 10. Other terms such as "up", "above", "over" may be based on this convention. Further based on the above convention, the term "wall" may refer to material formed as a plane in a vertical orientation and the term "divider" may refer to material formed as a plane in a horizontal orientation. Also, FIGS. 1 and 3 depict cutaway views of chassis 102 relative to a midline of main duct 10, wherein the terms "lateral" and "outer" may refer to a direction away from the midline but still inside main duct 10.

Referring to FIGS. 3, 4A and 4B, air duct 300 comprises outer walls 202, inner walls 208, chassis divider 110 in contact with inner walls 208 and outer walls 202, initial dividers 206, intermediate divider 212, intermediate wall 210, upper lateral channel divider 216 and upper divider 224.

Air duct 300 comprises outer walls 202, chassis divider 110 and a top surface (not shown). Air duct 300 may comprise a main channel defined in part by inner walls 208, chassis divider 110 and a top surface (not shown), wherein both sockets 104 are positioned in the main channel. Air duct 300 further comprises lateral channels defined between inner walls 208 and outer walls 202 for bypassing either first socket 104-1 or second socket 104-2, discussed in greater detail below.

In some embodiments, outer walls 202 of air duct 300 may be integral with walls 106 of an air duct in chassis 102.

Inner walls 208 may be configured with initial openings 302-1 and 302-2 located between fans 108A and first socket 104-1, intermediate openings 304-1 and 304-2 and bypass openings 306-1 and 306-2 located between first socket 104-1 and second socket 104-2, and end openings 308-1 and 308-2 located between second socket 104-2 and fans 108B, discussed in greater detail below.

Lateral channels are formed on either side of the main channel between each inner wall 208 and a corresponding outer wall 202, initial divider 206 and chassis divider 110. Initial openings 302 in inner walls 208 allow airflow portion 1A to flow into both lateral channels to bypass first socket 104-1. The location of intermediate openings 304 between first socket 104-1 and second socket 104-2 allows airflow portion 1A to flow back into the main channel to cool the second socket 104-2. An upper lateral channel defined by each inner wall 208 and each outer wall 202, upper lateral channel divider 216 and the top surface (not shown) allows airflow portion 1B to bypass second socket 104-2. The location of bypass openings 306 between first socket 104-1 and second socket 104-2 allow airflow portion 1B to flow from the main channel to a bypass channel to bypass the second socket 104-1. The location of end openings 308 allows airflow portion 1B to flow back into the main channel.

Airflow Portion 1A Bypasses the First Socket

Initial openings 302 in inner walls 208 allow airflow portion 1A to flow into lateral channels defined between outer walls 202 and inner walls 208 and between initial divider 206 and chassis divider 110. Inner walls 208 prevent airflow portion 1A from flowing through first socket 104-1. Initial dividers 206 prevent airflow portion 1A from mixing with other airflows that may cool other components in chassis 102. Chassis divider 110 prevents airflow portion 1A from flowing into memory duct 12. Thus, first airflow portion 1A flows through initial openings 302 into lower lateral channels and bypasses first socket 104-1, wherein if airflow enters chassis 102 at 35 C, first airflow portion 1A bypassing first socket 104-1 may remain at approximately 35 C for improved cooling of second socket 104-2.

Airflow Portion 1A Cools the Second Socket

Referring to FIGS. 3 and 4A, intermediate openings 304 in inner walls 208 direct airflow portion 1A from lower lateral channels into the main channel to flow through second socket 104-2. Air duct 300 further comprises intermediate wall 210 and intermediate divider 212 coupled to inner walls 208 to prevent airflow portion 1A from mixing with airflow portions 1B and 2A, but airflow portion 1A may mix with airflow portion 2B to cool second socket 104-2. Airflow portion 1A may be constrained to flow through second socket 104-2 by inner walls 208, upper divider 224 and chassis divider 110. Once airflow portion 1A flows through second socket 104-2, airflow portion 1A may mix with other airflows 1B, 2A and 2B to remove heat to an ambient environment. Air duct 300 having this configuration may ensure that the temperature of airflow portion 1A that flows through second socket 104-2 may be close to 35 C by bypassing first socket 104-1.

Airflow Portion 1B Cools the First Socket

Air duct 300 may be configured to direct airflow portion 1B to flow through first socket 104-1 and bypass second socket 104-2. Inner walls 208, intermediate divider 212 in contact with each inner wall 208, and a top surface (not shown) direct airflow portion 1B to flow through first socket 104-1. Intermediate divider 212 may prevent airflow portion 1B from mixing with airflow portions 1A and 2B but may mix with airflow portion 2A to cool first socket 104-1.

Airflow Portion 1B Bypasses the Second Socket

Inner walls 208, intermediate divider 212 and intermediate wall 210, and intermediate duct openings 306 in inner walls 208 redirect airflow portion 1B (heated due to cooling first socket 104-1) to bypass second socket 104-2. Airflow portion 1B exiting first socket 104-1 contacts intermediate wall 210, wherein intermediate divider 212 and inner walls 208 direct airflow portion 1B to flow up.

In some embodiments, intermediate divider 212 and intermediate wall 210 form a continuous surface. As depicted in FIG. 3, in some embodiments, intermediate divider 212 and intermediate wall 210 join at a curvature. In some embodiments, intermediate wall 210 is oriented approximately perpendicular to chassis divider 110 or orthogonal to a direction of airflow generated by fans 108. In some embodiments, intermediate wall 210 is oriented at an angle to a direction of airflow generated by fans 108 such that airflow 1B exiting first socket 104-1 has a less abrupt change in direction due to contact with intermediate wall 212.

Bypass openings 306 in inner walls 208 allow airflow 1B to flow into upper lateral channels formed between inner walls 208, outer walls 202, upper lateral channel divider 216 and a top surface (not shown). The upper lateral channels ensure airflow portion 1B bypasses second socket 104-2 and directs airflow portion 1B through end openings 308 in inner walls 208 such that airflow portion 1B re-enters the main channel. Once airflow portion 1B is in the main channel, airflow portion 1B may mix with other airflows 1A, 2A and 2B and exit chassis 102 to remove heat from information handling system 100 to an ambient environment. Using this configuration, the temperature of the airflow portion 1B exiting first socket 104-1 may be higher than 35 C but bypasses second socket 104-2.

Airflow Portion 2A Cools the First Socket

Air duct 300 may be configured to direct airflow portion 2A to cool first socket 104-1 and bypass second socket 104-2. As described above with respect to airflow portion 1B, inner walls 208, initial divider 212 and a top surface (not shown) may direct airflow portion 2A to flow through first socket 104-1. Initial divider 212 prevents airflow portion 2A from mixing with other airflows 1A and 2B but may mix with airflow portion 1B.

Airflow Portion 2A Bypasses the Second Socket

Intermediate divider 212, intermediate wall 210 and inner walls 208 direct airflow portion 2A to flow up to bypass second socket 104-2. Intermediate wall 210 extends between inner walls 208 but does not contact the top surface. Instead, intermediate wall 210 may contact upper divider 224, wherein upper divider 224, inner walls 208 and top surface 402 form a bypass channel to direct airflow portion 2A over second socket 104-2. Once airflow portion 2A bypasses second socket 104-2, airflow portion 2A may mix with other airflows 1A, 2B and 2B and exit chassis 102 to remove heat from information handling system 100 to an ambient environment. Using this configuration, the temperature of airflow portion 2A exiting first socket 104-1 may be higher than 35 C but bypasses second socket 104-2.

Airflow 2B Bypasses the First Socket

Air duct 300 may be configured to direct airflow portion 2B to bypass first socket 104-1 and cool second socket 104-2. Referring to FIGS. 3 and 4B, a height of first socket 104-1 may be less than a height of second socket 104-2 such that airflow can occur between first socket 104-1 and chassis divider 110. Air duct 300 may comprise inner walls 208, chassis divider 110 and intermediate divider 212 forming a bypass duct, wherein airflow portion 2B flows between first socket 104-1 and chassis divider 110. In some embodiments, a base of first socket 104-1 may form part of intermediate divider 212. Airflow portion 2B may be prevented from mixing with other airflows 1B and 2A by intermediate divider 212 but may mix with airflow portion 1A once airflow portions 1A and 2B are past intermediate divider 212. Air duct 300 having this configuration may ensure airflow portion 2B bypasses first socket 104-1 such that the temperature of airflow portion 2B that that flows through second socket 104-2 may be close to 35 C.

Airflow 2B Cools the Second Socket

Inner walls 208, intermediate divider 212 and chassis divider 110 may direct airflow portion 2B to flow through second socket 104-2. Airflow portion 2B bypassing first socket 104-1 can mix with airflow portion 1A. In general, airflow portion 2B can flow through second socket 104-2 at any point along the height of second socket 104-2. However, airflow portion 2B may be more likely to flow through second socket 104-2 at a point closer to the heat generating component. Using this configuration, the temperature of airflow portion 2B flowing through second socket 104-2 may be close to 35 C and more cooling may occur closer to heat generating component.

Air duct 300 configured to divide the airflow into four portions 1A, 1B, 2A and 2B and provide dual parallel flow paths. By providing multiple parallel paths, airflow generated by fans 108 can take multiple paths, wherein the resistance of each path may be reduced for improved cooling.

The following tables illustrate advantages of one including an embodiment of air duct 300 in a main duct 10 of chassis 102 in a dual socket information handling system.

TABLE 1

|  | Dual sockets aligned axially in a single airflow-Baseline CPU power and fan speed | Dual sockets aligned axially with dual parallel path cooling system-Baseline CPU power and fan speed | Dual sockets aligned axially with dual parallel path cooling system-Higher CPU power and fan speed | Dual sockets aligned axially with dual parallel path cooling system-Baseline CPU power and fan speed |
|---|---|---|---|---|
| Fan Speed | Baseline | Baseline | Baseline | 81.5% of baseline |
| CPU Power-Each socket (Watts) | 205 W | 205 W | 240 W | 205 W |
| Front CPU | 59.8 C. | 68.5 | 74.2 | 74.7 |
| Rear CPU | 75 C. | 68.2 | 73.7 | 74.2 |
| Acoustic change | Baseline | Same as baseline | Same as baseline | Baseline-4.4 dBA |

As depicted in TABLE 1, for a common approach such as depicted in FIG. 1, in a dual socket information handling system 100 with each CPU operating at 205 Watts (W) and fans 108 operating at a baseline fan speed determined not to exceed a maximum acoustic noise level, the front CPU (corresponding to first socket 104-1) may reach a temperature of 59.1 C but the rear CPU (corresponding to second socket 104-2) may reach the maximum operating temperature of 75 C. Increasing the fan speed may not be feasible due to requirements for the acoustic noise generated by fans 108 to be below a threshold level. Thus, power to one or both CPUs must be restricted to prevent damage to the second CPU.

By comparison, for chassis 102 including one embodiment of air duct 300, for the same fan speed and with both CPUs operating at 205 W, the front CPU (corresponding to first socket 104-1) may reach a temperature of 68.5 C which is an increase over the baseline temperature. However, the rear CPU (corresponding to second socket 104-2) may be cooled to a temperature of 68.2 C. Thus, information handling system 100 in chassis 102 with an embodiment of air duct 300 does not exceed the maximum operating temperature of either CPU when fans 108 operate at the baseline fan speed.

Regarding CPU power, for information handling system 100 in chassis 102 including embodiments of a dual parallel cooling system and operating fans 108 at the baseline fan speed, both CPUs may operate at 240 W. The front CPU (corresponding to first socket 104-1) may reach a temperature of 74.2 C and the rear CPU (corresponding to second socket 104-2) may reach a temperature of 73.7 C. Thus, embodiments may allow information handling systems 100 in chassis 102 to operate CPUs with approximately 17% more power at the same fan speed without exceeding the maximum operating temperature for either CPU.

Regarding fan speed, for information handling system 100 in chassis 102 including embodiments of a dual parallel cooling system, CPUs may operate at 205 W and fans 108 may operate at approximately 81% of the baseline fan speed but still cool both CPUs. The front CPU (corresponding to first socket 104-1) may reach a temperature of 74.7 C and the rear CPU (corresponding to second socket 104-2) may reach a temperature of 74.2 C, but the acoustic noise may be reduced by approximately 4.4 dBA. Thus, embodiments may allow CPUs in sockets 104 to operate at a lower fan speeds for quieter operation and power use without exceeding the maximum operating temperature for either CPU.

TABLE 2

|  | Dual sockets aligned axially in a single airflow | Dual sockets aligned axially in a single airflow + an intermediate fan between the two sockets | Dual sockets aligned axially with dual parallel path cooling system |
|---|---|---|---|
| Fan speed (all fans) | 54% | 54% | 54% |
| CPU Power (each) | 205 W | 205 W | 205 W |
| Front CPU temperature (C) | 59.8 | 58.1 | 68.5 |
| Rear CPU temperature (C) | 75.1 | 68.3 | 68.2 |
| Acoustic change | Baseline | Baseline + approximately 1 dBA | Same as baseline |

As depicted in TABLE 2, for a common cooling approach such as depicted in FIG. 1, in a chassis 102 for a dual socket information handling system 100 with each CPU operating at 205 Watts (W) and fans 108 operating at a baseline speed, the front CPU (corresponding to first socket 104-1) may reach a temperature of 59.1 C but the rear CPU (corresponding to second socket 104-2) may reach the maximum operating temperature of 75 C. Increasing fan speed is not feasible due to requirements for the acoustic noise generated by fans 108 to be below a threshold.

By comparison, for embodiments of chassis 102 including an intermediate fan (not shown) positioned between sockets 104-1 and 104-2 and operating at the baseline fan speed, for the same fan speed and both CPUs operating at 205 W, the front CPU (corresponding to first socket 104-1) may reach a temperature of 58.1 C which is a decrease over the baseline temperature. The rear CPU (corresponding to second socket 104-2) may be cooled to a temperature of 68.3 C, which is also a decrease. However, the additional fan increases the acoustic noise approximately 1 dBA which may exceed requirements for providing a quiet information handling system 100 for a better user experience.

By comparison, for embodiments of chassis 102 including air duct 300, for the same fan speed but both CPUs operating at 205 W, the front CPU (corresponding to first socket 104-1) may reach a temperature of 68.5 C and the rear CPU (corresponding to second socket 104-2) may reach a temperature of 68.2 C. The operating temperature of each CPU may be higher, but the power used by fans 108 and the acoustic noise remains the same as the baseline.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A dual parallel path cooling system for removing heat from two sockets in an air duct in a chassis of an information handling system, the air duct defined by a top surface, a chassis divider and two outer walls, each outer wall extending a length between a first fan and a second fan and extending between the chassis divider and the top surface, wherein the first fan and the second fan generate an airflow through the air duct, the dual parallel path cooling system comprising:
    two inner walls, each inner wall parallel with the two outer walls and extending between the first fan and the second fan, each inner wall comprising an initial opening formed between the first fan and a first socket of the two sockets, an intermediate opening formed between the first socket and a second socket of the two sockets, a bypass opening formed between the first socket and the second socket, and an end opening formed between the second socket and the second fan, wherein the two inner walls, the chassis divider and the top surface form a main channel;
    two initial dividers, wherein each initial divider extends between one inner wall and a corresponding outer wall, wherein each initial divider, the inner wall, the corresponding outer wall and the chassis divider form a lower lateral channel;
    an intermediate divider extending between the two inner walls and positioned parallel to the chassis divider;
    an intermediate wall extending between the two inner walls and positioned a height above the chassis divider;
    an upper divider extending between the two inner walls and positioned above the second socket, wherein the two inner walls, the upper divider and the chassis divider form a bypass duct; and
    an upper lateral channel divider extending between each inner wall and each outer wall, wherein the upper lateral channel divider, the inner wall, the outer wall and the top surface form an upper lateral channel,
    wherein the main channel is connected to the upper lateral channel by the bypass opening,
    wherein the lower lateral channel is connected to the bypass duct by the intermediate opening,
    wherein the intermediate divider, the intermediate wall, and the upper divider are integrated to physically separate the bypass opening from the intermediate opening such that the bypass duct is separated from the main channel,
    wherein the bypass opening is spaced-apart from the chassis divider a first distance and the intermediate opening is spaced-apart from the chassis divider a second distance less than the first distance to separate the upper lateral channel from the lower later channel such that the bypass duct is separated from the main channel.

2. The dual parallel path cooling system of claim 1, wherein the first socket has a first height and the second socket has a second height greater than the first height, wherein the intermediate divider is positioned relative to a base of the first socket.

3. The system of claim 1, wherein a base of the first socket forms part of the intermediate divider.

4. The system of claim 1, wherein the intermediate wall is orthogonal to a flow direction of the airflow generated by the first fan and the second fan.

5. The system of claim 1, wherein the intermediate wall is oriented at an angle relative to a flow direction of the airflow generated by the fans.

6. The system of claim 1, wherein the chassis divider separates the air duct from a memory duct.

7. The system of claim 1, wherein a top surface of the second socket forms part of the bypass duct.

8. The system of claim 1, wherein the top surface comprises a panel of the chassis.

9. The system of claim 1, wherein the outer walls of the air duct are integrated with side walls of a main duct of the chassis.

10. A chassis of an information handling system, the chassis comprising:
    a first fan on a first side of the chassis;
    a second fan on a second side of the chassis opposite the first side, wherein the first fan and the second fan generate an airflow; and
    an air duct in a main duct, the air duct comprising:
        a top surface;
        a chassis divider;
        two outer walls, each outer wall extending a length between the first fan and the second fan and extending between the chassis divider and the top surface;
        two inner walls, each inner wall parallel with the two outer walls and extending between the first fan and the second fan, each inner wall comprising an initial opening formed between the first fan and a first socket of two sockets, an intermediate opening formed between the first socket and a second socket of the two sockets, a bypass opening formed between the first socket and the second socket, and an end opening formed between the second socket and the second fan, wherein the two inner walls, the chassis divider and the top surface form a main channel;
        two initial dividers, wherein each initial divider extends between one inner wall and a corresponding outer wall, wherein each initial divider, the inner wall, the corresponding outer wall and the chassis divider form a lower lateral channel:
        an intermediate divider extending between the two inner walls and positioned parallel to the chassis divider;
        an intermediate wall extending between the two inner walls and positioned a height above the chassis divider;
        an upper divider extending between the two inner walls and positioned above the second socket, wherein the two inner walls, the upper divider and the chassis divider form a bypass duct; and
        an upper lateral channel divider extending between each inner wall and each outer wall, wherein the upper lateral channel divider, the inner wall, the outer wall and the top surface form an upper lateral channel,
        wherein the main channel is connected to the upper lateral channel by the bypass opening, wherein the lower lateral channel is connected to the bypass duct by the intermediate opening, wherein the intermediate divider, the intermediate wall, and the upper divider are integrated to physically separate the bypass opening from the intermediate opening such that the bypass duct is separated from the main channel, wherein the bypass opening is spaced-apart from the chassis divider a first distance and the intermediate opening is spaced-apart from the chassis divider a second distance less than the first distance to separate the upper lateral channel from the lower later channel such that the bypass duct is separated from the main channel.

11. The chassis of claim 10, wherein the first socket has a first height and the second socket has a second height greater than the first height, wherein the intermediate divider is positioned relative to a base of the first socket.

12. The chassis of claim 11, wherein the base of the first heat socket forms part of the intermediate divider.

13. The chassis of claim 10, wherein the intermediate wall is orthogonal to a flow direction of the airflow generated by the first fan and the second fan.

14. The chassis of claim 10, wherein the intermediate wall is oriented at an angle relative to a flow direction of the airflow generated by the fans.

15. The chassis of claim 10, wherein the chassis divider separates the air duct from a memory duct.

16. The chassis of claim 10, wherein a top surface of the second socket forms part of the bypass duct.

17. The chassis of claim 10, wherein the top surface comprises a panel of the chassis.

18. The chassis of claim 10, wherein the outer walls of the air duct are integrated with side walls of the main duct of the chassis.

* * * * *